(12) United States Patent
Song et al.

(10) Patent No.: US 9,502,341 B2
(45) Date of Patent: Nov. 22, 2016

(54) PRINTED CIRCUIT BOARD AND SEMICONDUCTOR PACKAGE USING THE SAME

(71) Applicant: Samsung Electronics Co., Ltd., Suwon-si, Gyeonggi-do (KR)

(72) Inventors: Jik-Ho Song, Seoul (KR); Ga-Young Kim, Cheonan-si (KR); Woo-Jae Kim, Hwaseong-si (KR); Young-Hoon Ro, Cheonan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 67 days.

(21) Appl. No.: 14/640,011

(22) Filed: Mar. 5, 2015

(65) Prior Publication Data
US 2016/0049379 A1    Feb. 18, 2016

(30) Foreign Application Priority Data

Aug. 14, 2014 (KR) ........................ 10-2014-0106071

(51) Int. Cl.
*H01L 23/00* (2006.01)
*H01L 23/498* (2006.01)
(Continued)

(52) U.S. Cl.
CPC ....... *H01L 23/49838* (2013.01); *H01L 21/563* (2013.01); *H01L 23/49894* (2013.01); *H01L 24/14* (2013.01); *H01L 24/73* (2013.01); *H01L 24/83* (2013.01); *H05K 1/00* (2013.01); *H01L 24/13* (2013.01); *H01L 24/16* (2013.01); *H01L 24/29* (2013.01); *H01L 24/32* (2013.01); *H01L 25/0655* (2013.01); *H01L 2224/131* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/14132* (2013.01); *H01L 2224/14133* (2013.01); *H01L 2224/14135* (2013.01); *H01L 2224/14136* (2013.01); *H01L 2224/14165* (2013.01); *H01L 2224/16227* (2013.01); *H01L 2224/2919* (2013.01); *H01L 2224/2929* (2013.01); *H01L 2224/29194* (2013.01); *H01L 2224/29294* (2013.01);
(Continued)

(58) Field of Classification Search
CPC ..................................................... H01L 21/563
See application file for complete search history.

(56) References Cited

U.S. PATENT DOCUMENTS

| | | | |
|---|---|---|---|
| 6,546,622 B2 | 4/2003 | Iba et al. | |
| 7,109,067 B2 | 9/2006 | Kobayashi | |
| 7,755,203 B2 * | 7/2010 | Nishimura | ............ H01L 21/563 257/778 |

(Continued)

FOREIGN PATENT DOCUMENTS

| | | |
|---|---|---|
| JP | 2011082305 A | 4/2011 |
| KR | 20110047834 A | 5/2011 |

(Continued)

*Primary Examiner* — Valerie N Newton
(74) *Attorney, Agent, or Firm* — Renaissance IP Law Group LLP

(57) ABSTRACT

Embodiments of the inventive aspect include a printed circuit board and a semiconductor package using the same. The semiconductor package includes a substrate having one or more connection pads, semiconductor chips mounted on the substrate, an underfill layer filling a region between the semiconductor chips and the substrate, and solder bumps electrically connecting the connection pads and the semiconductor chips in the underfill layer. The substrate includes void preventing patterns protruding on a top surface of the substrate under the underfill layer.

14 Claims, 15 Drawing Sheets

(51) Int. Cl.
*H01L 21/56* (2006.01)
*H05K 1/00* (2006.01)
*H01L 25/065* (2006.01)

(52) U.S. Cl.
CPC ............ *H01L 2224/32225* (2013.01); *H01L 2224/73204* (2013.01); *H01L 2224/83101* (2013.01); *H01L 2224/83102* (2013.01); *H01L 2224/83385* (2013.01); *H01L 2224/83855* (2013.01); *H01L 2924/1579* (2013.01); *H01L 2924/15311* (2013.01); *H01L 2924/15787* (2013.01); *H01L 2924/16251* (2013.01)

(56) References Cited

U.S. PATENT DOCUMENTS

| | | | |
|---|---|---|---|
| 8,174,117 | B2 | 5/2012 | Ishido |
| 8,426,959 | B2 | 4/2013 | Park et al. |
| 2009/0229513 | A1 | 9/2009 | Hisada et al. |
| 2014/0048934 | A1 | 2/2014 | Chen et al. |

FOREIGN PATENT DOCUMENTS

| | | |
|---|---|---|
| KR | 20120032764 A | 4/2012 |
| KR | 20140020115 A | 2/2014 |

\* cited by examiner

PRINTED CIRCUIT BOARD AND SEMICONDUCTOR PACKAGE USING THE SAME

CROSS-REFERENCE TO RELATED APPLICATION

This application claims priority from Korean Patent Application No. 10-2014-0106071 filed on Aug. 14, 2014 in the Korean Intellectual Property Office, and all the benefits accruing therefrom under 35 U.S.C. 119, the contents of which in its entirety are herein incorporated by reference.

BACKGROUND

1. Field

The inventive concept relates to a printed circuit board and a semiconductor package using the same.

2. Related Art

Wire-bonding technology has been used in connecting chips of a semiconductor package to a substrate. However, an integration level of wires may increase during a semiconductor packaging process due to an increase in the number of input/output pads.

With the increased wire integration level, the semiconductor packaging process is difficult to achieve. Accordingly, in order to overcome the disadvantage, a flipchip bonding process has been developed. The flipchip bonding process directly connects solder bumps formed on the surface of a chip to a substrate. Since the solder bumps used in the flipchip bonding process are brittle, they may be susceptible to shock. Therefore, an underfill technique is used for protecting a solder bump by filling a lower portion of the chip with a material. The underfill region can be formed by filling a lower portion of the chip with a liquid type underfill material using a capillary effect by dispensing the liquid underfill material to a chip side.

In filling the underfill region with the underfill material, movement of the underfill material may be retarded by the solder bumps. In addition, a moving speed of the underfill material varies according to arrangement of the solder bumps, which can cause a void to be created under the chips. Embodiments of the inventive concept address these and other limitations in the prior art.

SUMMARY

Embodiments of the inventive concept include a semiconductor package having improved reliability by preventing a void from being formed under a chip.

Embodiments of the inventive concept include a printed circuit board having improved reliability by preventing a void from being formed under a chip.

According to an aspect of the inventive concept, there is provided a semiconductor package including a substrate including one or more connection pads, semiconductor chips mounted on the substrate, an underfill layer filling a region between the semiconductor chips and the substrate, and solder bumps electrically connecting the connection pads and the semiconductor chips in the underfill layer, wherein the substrate includes a void preventing pattern protruding on a top surface of the substrate under the underfill layer.

Top surfaces of the void preventing patterns are not in contact with bottom surfaces of the semiconductor chips.

The substrate includes a solder resist layer planarly formed on its surface and the void preventing patterns are formed on the solder resist layer.

The solder resist layer and the void preventing patterns include the same or similar material.

A top surface of the solder resist layer is higher than top surfaces of the connection pads.

The top surfaces of the void preventing patterns are positioned higher than or at the same height with the top surface of the solder resist layer.

The void preventing patterns have a height in a range of 3 micrometers (μm) to 30 μm.

A region having the void preventing patterns is not overlapped with a region having the connection pads.

According to another aspect of the inventive concept, there is provided a semiconductor package including a substrate including first and second regions on a top surface of the substrate, the first and second regions not overlapping with each other, a plurality of connection pads spaced apart from each other on the first region, and void preventing patterns protruding on the second region of the top surface of the substrate.

The semiconductor package may further comprise semiconductor chips mounted on the substrate that overlap with the first and second regions.

The semiconductor chips include solder bumps disposed at bottom surfaces thereof to be brought into contact with the connection pads.

The void preventing patterns include bar patterns shaped of bars separated from each other by a predetermined distance.

The bar patterns extend in one direction in parallel with each other.

At least some of the bar patterns include one or more trenches separating the bar patterns from each other.

The void preventing patterns include a plurality of dot patterns shaped of islands having the same or similar shape, and the plurality of dot patterns are arranged uniformly in a regular cycle.

According to still another aspect of the inventive concept, there is provided a printed circuit board including an inner resin layer, a first conductive coating formed on a surface of the inner resin layer, an outer resin layer covering the first conductive coating, a first solder resist layer planarly formed on the outer resin layer, and a second solder resist layer protruding on the first solder resist layer.

The outer resin layer includes a via exposing the first conductive coating. The printed circuit board may further include a second conductive coating covering an inner wall of the via and a surface of the outer resin layer and making contact with the first conductive coating. The printed circuit board may further include connection pads making contact with the second conductive coating on the second conductive coating and the outer resin layer.

The first solder resist layer is not overlapped with the connection pads.

The printed circuit board may comprise a third solder resist layer protruding on the second solder resist layer.

The second solder resist layer is patterned on a region having an underfill layer on the first solder resist layer.

Embodiments of the inventive aspect may include a semiconductor package comprising a substrate including a plurality of connection pads in a first region, one or more semiconductor chips, a plurality of solder bumps electrically connecting the plurality of connection pads in the first region to the one or more semiconductor chips, a second region between the substrate and the one or more semiconductor chips in which no connection pads and no solder bumps are disposed, an underfill layer disposed between the substrate and the one or more semiconductor chips, the underfill layer encapsulating the plurality of solder bumps, and a plurality of void preventing patterns disposed in the second region, the plurality of void preventing patterns configured to prevent a void in the underfill layer.

The plurality of void preventing patterns may include a plurality of bars in parallel with each other. The plurality of bars are not in direct contact with the one or more semiconductor chips. The plurality of bars may extend in a dispensing direction of the underfill layer. The plurality of bars may be arranged in parallel with the dispensing direction.

The plurality of void preventing patterns may include a plurality of bars in parallel with each other. The plurality of bars are not in direct contact with the one or more semiconductor chips. The plurality of bars may extend in a diagonal dispensing direction of the underfill layer. The diagonal dispensing direction may be relative to the edges of the substrate. The plurality of bars may be arranged in parallel with the dispensing direction.

The plurality of void preventing patterns may include a plurality of three-dimensional dots. The plurality of three-dimensional dots are not in direct contact with the one or more semiconductor chips. The plurality of three-dimensional dots may be spaced apart from each other by a predetermined interval.

The plurality of void preventing patterns may include a plurality of discontinuous bars in parallel with each other. The plurality of discontinuous bars are not in direct contact with the one or more semiconductor chips. The plurality of discontinuous bars may extend in a dispensing direction of the underfill layer. The plurality of discontinuous bars may be arranged in parallel with the dispensing direction.

BRIEF DESCRIPTION OF THE DRAWINGS

The above and other features and advantages of the inventive concept will become more apparent from the following description with reference to the attached drawings in which.

DETAILED DESCRIPTION OF EXAMPLE EMBODIMENTS

Figure 1:
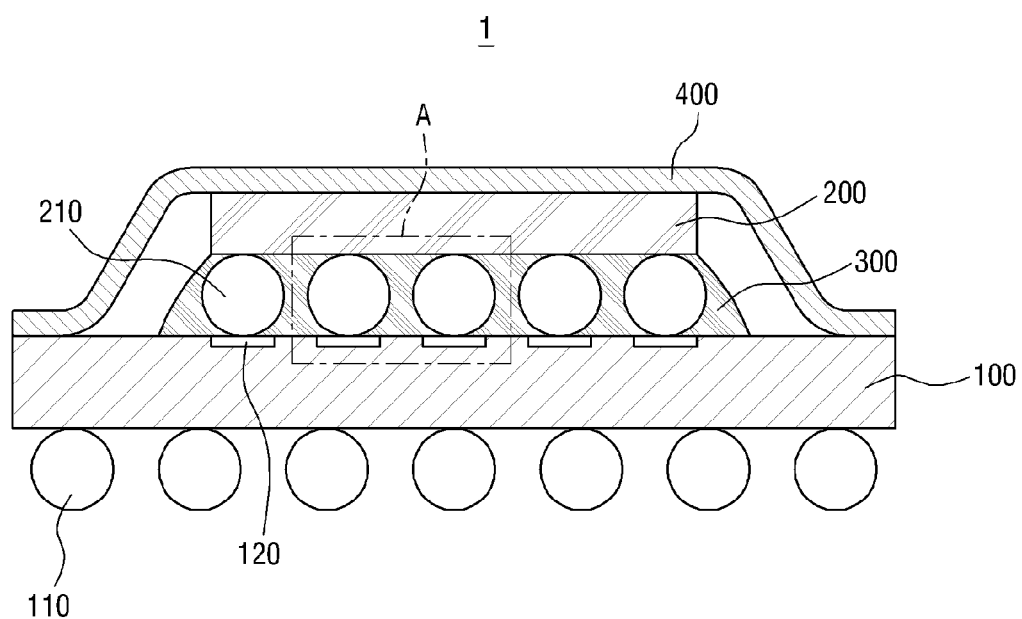
FIG. 1 is a cross-sectional view for explaining a configuration of a semiconductor package according to a first embodiment of the inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein Hereinafter, a semiconductor package according to a first embodiment of the inventive concept will be described with reference to FIGS. 1 to 5.

FIG. 1 is a cross-sectional view for explaining a configuration of a semiconductor package according to a first embodiment of the inventive concept.

Referring to FIG. 1, the semiconductor package 1 according to a first embodiment of the inventive concept includes a substrate 100, semiconductor chips 200, an underfill layer 300 and a lead 400.

The substrate 100 may be a package substrate such as a printed circuit board or a ceramic substrate. The substrate 100 may include a single layer or multiple layers. The substrate 100 has a top surface and a bottom surface. The substrate 100 may include a plurality of connection pads 120. The connection pads 120 may be positioned on a top surface of the substrate 100.

The connection pads 120 may be pads for electrically connecting the substrate 100 to the semiconductor chips 200 mounted on the substrate 100. Therefore, the connection pads 120 may be formed using a conductive material through which electricity flows. The connection pads 120 may be connected to electrical circuits formed on the substrate 100. For example, the electrical circuits may include wiring patterns. Portions of the wiring patterns may be connected to the outside (e.g., to a device, terminal, circuit, or the like, that is external relative to the package 1).

A solder ball pad may be formed on a bottom surface of the substrate 100. The solder ball pad may include a plurality of solder ball pads. The solder ball pad may be a pad for electrically connecting the substrate 100 to another device. The solder ball pad may be a portion at which the solder balls 110 make contact with the substrate 100. That is to say, the solder balls 110 may be brought into contact with the bottom surface of the substrate 100. The solder ball pads may be connected to electrical circuits formed under the substrate 100. For example, the solder ball pads may be connected to wiring patterns. Portions of the wiring patterns may be connected to the outside (e.g., to a device, terminal, circuit, or the like, that is external relative to the package 1).

The semiconductor chips 200 may be formed on the top surface of the substrate 100. The semiconductor chips 200 may be mounted on the top surface of the substrate 100 using a predetermined adhesion means. The predetermined adhesion means may include, for example, a liquid type epoxy, an adhesive tape, or a conductor medium, but aspects of the present inventive concept are not limited thereto.

The semiconductor chips 200 may be mounted on a central region of the top surface of the substrate 100, but aspects of the inventive concept are not limited thereto. The solder bumps 210 may be formed on bottom surfaces of the semiconductor chips 200. The semiconductor chips 200 may be electrically connected to the substrate 100 using the solder bumps 210. That is to say, the semiconductor chips 200 may be electrically connected to the solder bumps 210, which are electrically connected to the substrate 100.

The solder bumps 210 may be positioned to correspond to the connection pads 120 of the substrate 100. The solder bumps 210 may be connected to the connection pads 120 in a one-to-one relationship. That is to say, the solder bumps 210 may include a plurality of solder bumps. The respective solder bumps 210 may be positioned on the plurality of connection pads 120. In other words, each of the solder bumps 210 may be positioned on a corresponding one of the plurality of connection pads 120. The solder bumps 210 may be brought into direct contact with the connection pads 120 to be electrically connected.

The solder bumps 210 may be formed using a conductive material through which electricity flows. The solder bumps 210 may include, for example, gold, silver, nickel, copper, tin, or any combinations thereof. More specifically, the solder bumps 210 may be formed using copper-nickel-lead (Cu—Ni—Pb), copper-nickel-gold (Cu—Ni—Au), copper-nickel (Cu—Ni), nickel-gold (Ni—Au), or nickel-silver (Ni—Ag), but aspects of the present inventive concept are not limited thereto.

The solder bumps 210 may support the semiconductor chips 200 mounted on the substrate 100. That is to say, since the semiconductor chips 200 are positioned on the solder bumps 210, the solder bumps 210 may support the semiconductor chips 200.

The underfill layer 300 may be formed under the semiconductor chips 200. The underfill layer 300 may be formed on the substrate 100. The underfill layer 300 may fill a region between the semiconductor chips 200 and the substrate 100. That is to say, the underfill layer 300 may be formed between the semiconductor chips 200 and the substrate 100. The underfill layer 300 may fill portions between the solder bumps 210. That is to say, the underfill layer 300 may fill empty spaces between the substrate 100 and the semiconductor chips 200. In other words, the underfill layer 300 may encapsulate the solder bumps 210.

The underfill layer 300 is formed to prevent solder bonding reliability from being lowered due to a difference in the coefficient of thermal expansion (CTE) between the semiconductor chips 200 and the substrate 100. That is to say, the portions between the semiconductor chips 200 and the substrate 100 are filled with a liquid type epoxy based material, including a filler, to then be cured to form the underfill layer 300, thereby compensating for the difference in the CTE between the semiconductor chips 200 and the substrate 100. The underfill layer 300 may include a mixture of a liquid type epoxy based material and approximately 50 to 70% of a filler, thereby providing a CTE value similar to that of solder. Accordingly, the difference in the CTE between the semiconductor chips 200 and the substrate 100 is reduced, thereby improving the solder bonding reliability.

The filling of the underfill material may be based on a capillary effect. The capillary effect refers to a phenomenon occurring due to a difference between cohesion of a liquid and adhesion between walls and the liquid. Since the cohesion of the underfill material is smaller than the adhesion between the top surface of the substrate 100 and the bottom surfaces of the semiconductor chips 200, the underfill material may be diffused to completely fill the top surface of the substrate 100 and the bottom surfaces of the semiconductor chips 200.

Further, the underfill layer 300 may surround the respective solder bumps 210 to insulate the same from each other. That is to say, the underfill layer 300 may prevent short circuits from occurring between the solder bumps 210. At the same time, the underfill layer 300 may also firmly support the solder bumps 210. That is to say, since the solder bumps 210 support the semiconductor chips 200, the underfill layer 300 may further firmly reinforce the supporting by the solder bumps 210.

The lead 400 may serve as a cover member of the semiconductor chips 200. The lead 400 may cover the semiconductor chips 200. A central portion of the lead 400 may be planar. The planar portion may cover the semiconductor chips 200. An edge of the lead 400 may be offset to be downwardly bent.

That is to say, as shown in FIG. 1, the central portion of the lead 400 may be adhered to top surfaces of the semiconductor chips 200 to then be brought into tight contact therewith. The top surfaces of the semiconductor chips 200 and the central portion of the lead 400 may be adhered to each other by an adhesion member.

The edge of the lead 400 may be adhered to an edge of the top surface of the substrate 100. The edge of the lead 400 may be adhered to the top surface of the substrate 100 using an adhesion member. That is to say, the central portion of the lead 400 may be fixed to the top surfaces of the semiconductor chips 200 and the edge thereof may be fixed to the top surface of the substrate 100.

The central portion of the lead 400 may be wider than the top surfaces of the semiconductor chips 200. Therefore, empty spaces may exist between each of a portion of the central portion of the lead 400 and the substrate 100 and between a lower portion of the edge of the lead 400 and the substrate 100, but aspects of the present inventive concept are not limited thereto.

Figure 2:
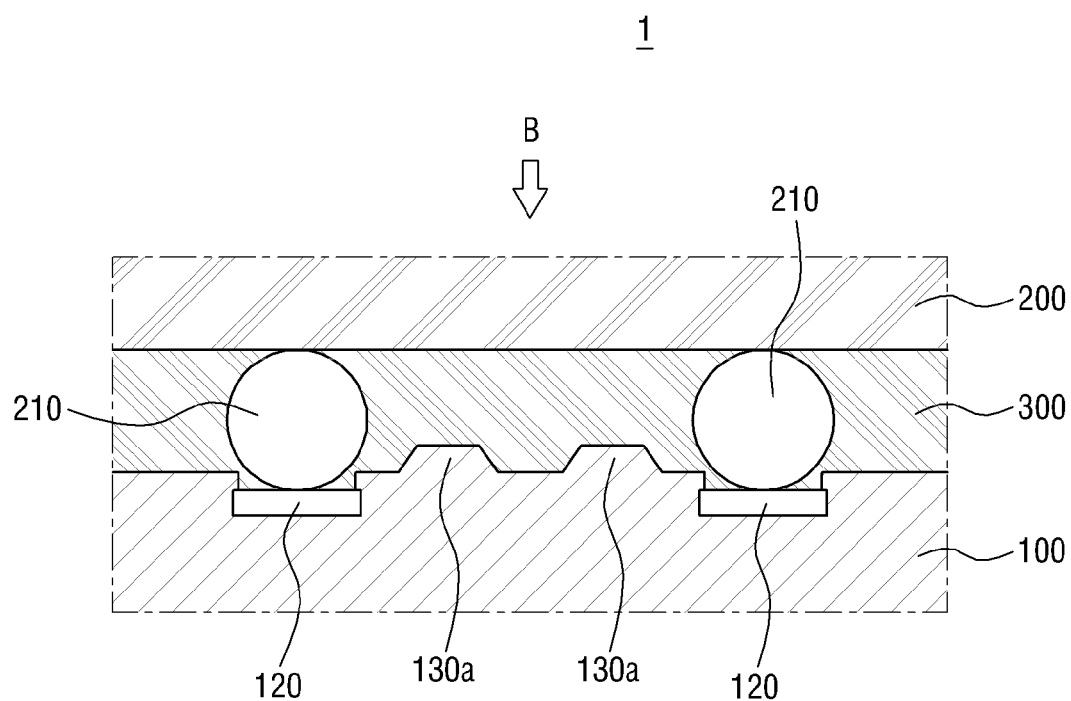
FIG. 2 is an enlarged view for specifically explaining a portion 'A' of FIG. 1.

FIG. 2 is an enlarged view for specifically explaining a portion 'A' of FIG. 1. Referring to FIG. 2, the substrate 100 may include connection pads 120 formed on its top surface. The top surfaces of the connection pads 120 may be positioned lower than the top surface of the adjacent portion of the substrate 100. That is to say, as shown in FIG. 2, the top surfaces of the connection pads 120 may be formed at positions that are substantially proximate to the top surface of the substrate 100, in which recesses are formed. This may allow the solder bumps 210 to be connected to the connection pads 120 in a more secure manner.

The substrate 100 may include first void preventing patterns 130a. The first void preventing patterns 130a may be positioned on the top surfaces of the substrate 100. The first void preventing patterns 130a may protrude from the top surfaces of the substrate 100. That is to say, top surfaces of the first void preventing patterns 130a may be positioned higher than or at the same height with the top surfaces of the substrate 100. The first void preventing patterns 130a may have a height in a range of, for example, 3 μm to 30 μm. The first void preventing patterns 130a may be formed by stacking solder resist layers. The heights of the first void preventing patterns 130a may be 3 μm or greater. In addition, since the first void preventing patterns 130a may be in contact with the bottom surfaces of the semiconductor chips 200, the heights of the first void preventing patterns 130a may be 30 μm or less, but aspects of the present inventive concept are not limited thereto.

The first void preventing patterns 130a may be positioned under the semiconductor chips 200. That is to say, the first void preventing patterns 130a may be positioned under the underfill layer 300 disposed under the semiconductor chips 200. The top surfaces of the first void preventing patterns 130a may not be in contact with the top surfaces of the semiconductor chips 200. This is for the purpose of preventing mechanical stress applied to the semiconductor package 1 from increasing.

The underfill layer 300 may be formed by dispensing the liquid type underfill material from a side surface between the semiconductor chips 200 and the substrate 100 to then be diffused, followed by curing. The underfill material 300 may be a sticky liquid and a diffusion speed of the underfill material is an important factor in forming the underfill layer 300. That is to say, if the underfill material is not evenly diffused, a void that is not filled with the underfill material may be formed. The first void preventing patterns 130a may prevent the void from being formed.

Hereinafter, a method for preventing the void from being formed by the first void preventing patterns 130a will be described with reference to FIGS. 3 to 5.

Figure 3:
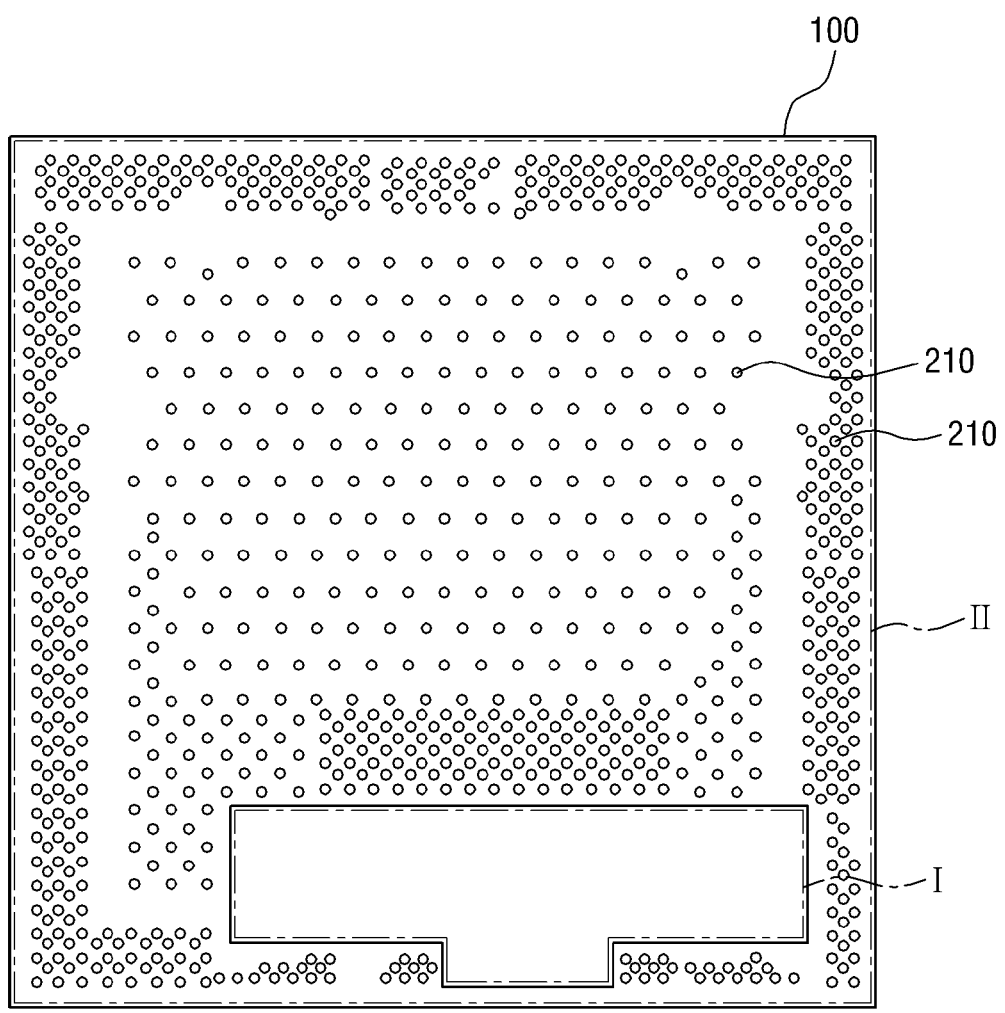
FIG. 3 is a plan view, excluding a void preventing pattern, for explaining arrangement of solder bumps positioned under chips of the semiconductor package according to the first embodiment of the inventive concept.

FIG. 3 is a plan view, excluding void preventing patterns, for explaining arrangement of solder bumps positioned under chips of the semiconductor package according to the first embodiment of the present inventive concept. FIG. 4 is a plan view, excluding void preventing patterns, for explaining the flow of an underfill material under chips of the semiconductor package according to the first embodiment of the present inventive concept. FIG. 5 is a plan view for explaining void preventing patterns of the semiconductor package according to the first embodiment of the inventive concept.

FIG. 3 illustrates arrangement of the solder bumps 210 positioned under the semiconductor chips 200. More specifically, FIG. 3 is a plan view taken in a 13' direction of FIG. 2, in which for the sake of illustration, the semiconductor chips 200 are see-through.

Referring to FIG. 3, the solder bumps 210 may be patterned in various distances and patterns under the semiconductor chips 200. The solder bumps 210 may be densely arranged in some regions or may be sparsely arranged in other regions according to internal structures of the semiconductor chips 200. That is to say, there may be regions in which a distance between the solder bumps 210 is relatively large and there may be regions in which a distance between the solder bumps 210 is relatively small. Further, there may exist a region without the solder bumps 210 under the semiconductor chips 200.

As described above, a first region I and a second region II may exist between lower portions of the semiconductor chips 200 and a top portion of the substrate 100. The solder bumps 210 may not be disposed in the first region I. The region without the solder bumps 210, such as the first region I, may exist according to the internal structures of the semiconductor chips 200. That is to say, in order to improve the reliability of the semiconductor chips 200, a particular portion of the semiconductor chips 200 may not be in contact with corresponding solder bumps 210. In other words, the solder bumps 210 may not be disposed under the particular portion of the semiconductor chips 200. That is to say, the first region I may not overlap with the second region II. In other words, the first region I may be a region in which no connection pads and no solder bumps are disposed. Since the solder bumps 210 may not exist in the first region I, the connection pads 120 may not be disposed in the first region I, either.

However, the solder bumps 210 may be disposed in the second region II. In addition, the connection pads 120 may also be disposed in the second region II. The first region I and the second region II may be mutually exclusive and may not overlap with each other. Although the second region II includes some regions where the solder bumps 210 do not exist, like the first region I, the solder bumps 210 may be formed in a narrower region than the first region I. That is to say, while the solder bumps 210 may generally be formed in the second region II in various densities, they may not exist at all in the first region I.

Figure 4:
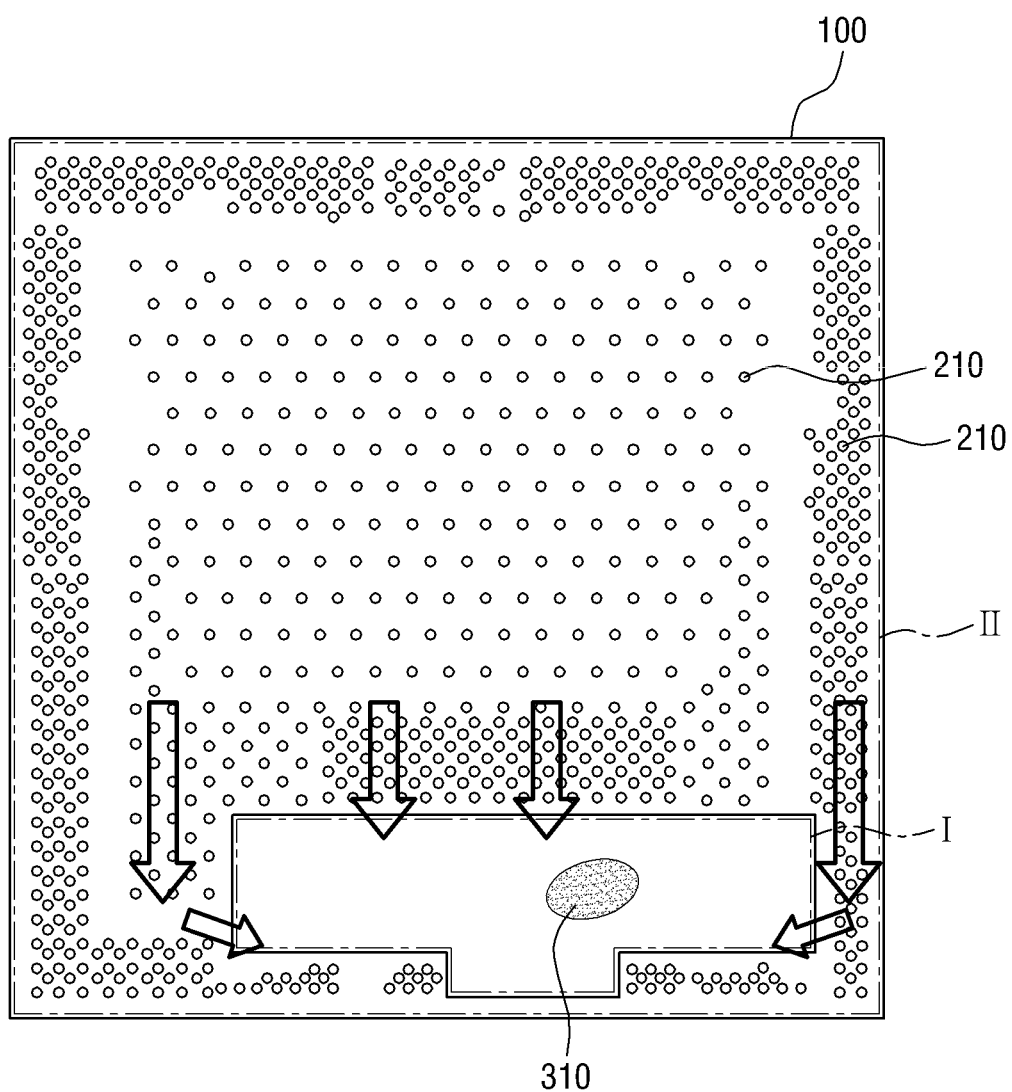
FIG. 4 is a plan view, excluding a void preventing pattern, for explaining the flow of an underfill material under chips of the semiconductor package according to the first embodiment of the inventive concept.

Referring to FIG. 4, a void 310 may be formed in the first region I. Arrows shown in FIG. 4 indicate general flows of an underfill material. If the underfill material is dispensed at a top portion of the substrate 100 (i.e., at a top portion of FIG. 4), the liquid type underfill material generally has a constant speed toward a bottom portion of the substrate 100 (i.e., toward a bottom portion of FIG. 4).

The solder bumps 210 may impede the flow of the underfill material. That is to say, the underfill material is diffused to fill the top surface of the substrate 100 and the bottom surfaces of the semiconductor chips 200 based on the capillary effect. In this case, the solder bumps 210 may reduce the diffusion speed of the underfill material.

The diffusion speed of the underfill material may be associated with the density of the solder bumps 210. That is to say, the flow rate of the underfill material may be proportional to a sectional area of a region through which the underfill material flows and the diffusion speed of the underfill material. A high density region of the solder bumps 210 may have a small sectional area of the region through which the underfill material flows, while a low density region of the solder bumps 210 may have a large sectional area of the region through which the underfill material flows. Since the overall flow rate of the underfill material is constant, the diffusion speed of the underfill material may be increased at the high density region of the solder bumps 210. Conversely, the diffusion speed of the underfill material may be decreased at the low density region of the solder bumps 210.

In FIG. 4, the diffusion speed of the underfill material may vary at a boundary between the second region II and the first region I, because the solder bumps 210 formed in the second region II have different densities according to their respective positions near the boundary between the second region II and the first region I. If the underfill material is diffused from the second region II to the first region I, the diffusion speed of the underfill material may be reduced due to an increase in the sectional area of the region through which the underfill material flows, because the solder bumps 210 are not formed in the first region I.

However, since the underfill material has different diffusion speeds at a boundary of the first region, the void 310 may be formed due to a difference in the diffusion speed.

The void 310 may be an internally empty portion. That is to say, the void 310 may be formed within the underfill layer 300. The void 310 may be a portion that is not filled with the underfill material.

The void 310 of the underfill layer 300 may not directly affect operation of the semiconductor chips 200 or the substrate 100 of the semiconductor package 1. However, according to the operation of the semiconductor chips 200 and the substrate 100, the internal temperature of the semiconductor package 1 may vary and the durability thereof may be considerably lowered due to the air that is present within the void 310. More specifically, as the internal air expands and shrinks according to the increased temperature of the semiconductor package 1, cracks may be formed in the underfill layer 300, thereby ultimately causing damage to the semiconductor package 1 due to the void 310. Therefore, when the underfill layer 300 is formed, it is advantageous to prevent the void 310 from being formed.

Figure 5:
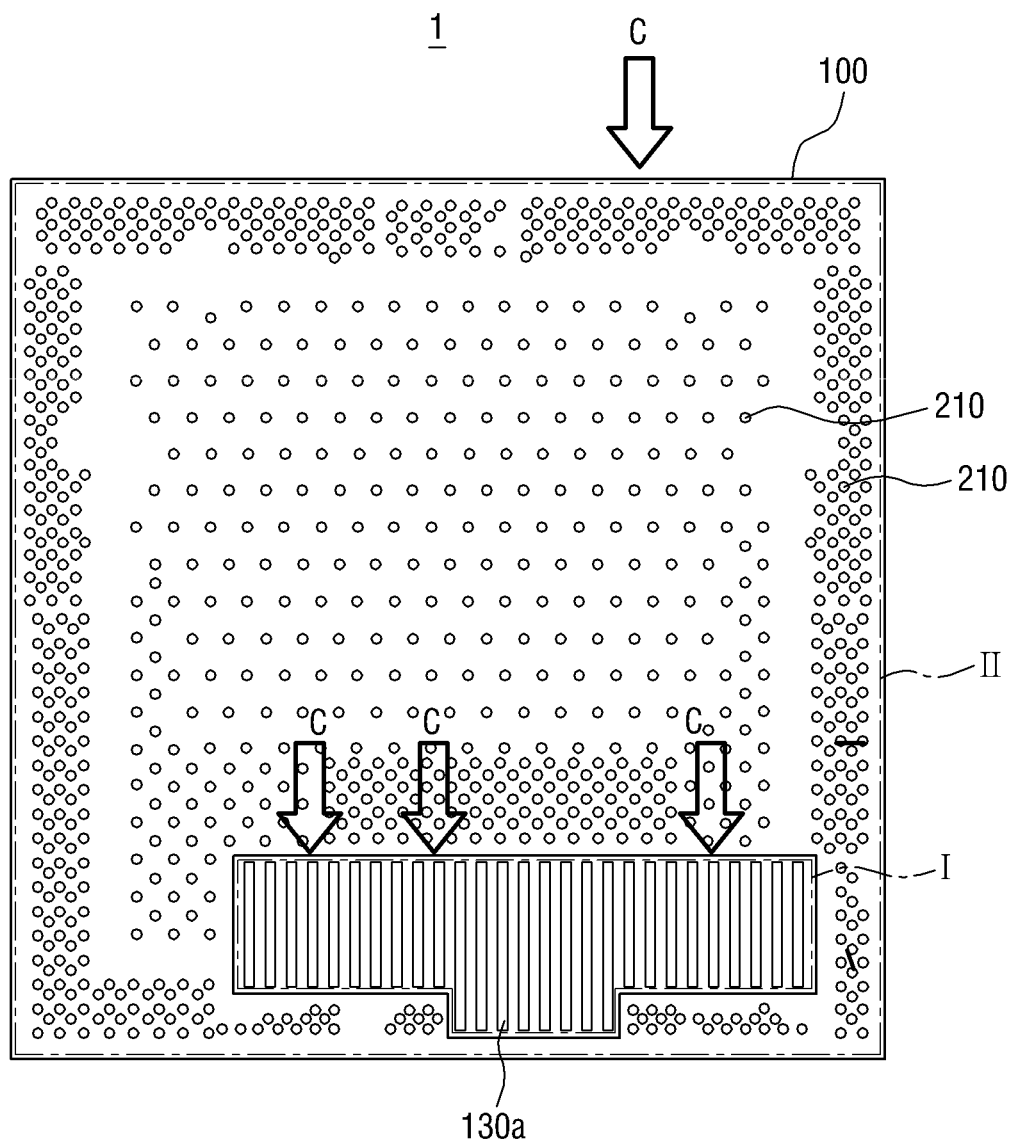
FIG. 5 is a plan view for explaining a void preventing pattern of the semiconductor package according to the first embodiment of the inventive concept.

Referring to FIG. 5, the semiconductor package 1 according to the first embodiment of the present inventive concept includes first void preventing patterns 130*a*.

The first void preventing patterns 130*a* may be formed under the semiconductor chips 200. The first void preventing patterns 130*a* may be formed in the first region I. The first void preventing patterns 130*a* may include a plurality of patterns separated from each other by a predetermined interval. Each of the first void preventing patterns 130*a* may be a pattern shaped of a bar. Each of the first void preventing patterns 130*a* may extend in a first direction C. The first void preventing patterns 130*a* may be arranged such that the underfill material supplied in the first direction C is rapidly diffused. In other words, the bars of the first void preventing patterns 103*a* may be arranged in parallel to the first direction C.

The first direction C may be a direction in which the underfill material is dispensed. That is to say, the first direction C may be a direction in which the underfill material is injected between the semiconductor chips 200 and the substrate 100. In FIG. 5, the underfill material may be injected from a top portion of the drawing in the first direction C.

Since the underfill material is injected in the first direction C in the first region I, it may be diffused along the first void preventing patterns 130*a* extending in the first direction C. In this case, the void (310 of FIG. 4) is prevented from being formed in the first region I.

The first void preventing patterns 130*a* may not be in direct contact with the semiconductor chips 200. Since the first void preventing patterns 130*a* are not in contact with the bottom surfaces of the semiconductor chips 200, the underfill material is not necessarily diffused only to regions separated by the first void preventing patterns 130*a*. That is to say, since there are regions on the first void preventing patterns 130*a*, through which the underfill material may flow, the underfill material may flow on the first void preventing patterns 130a to then fill the regions on the first void preventing patterns 130a as well.

In the semiconductor package 1 according to the first embodiment of the present inventive concept, the first void preventing patterns 130a are positioned within the underfill layer 300, thereby facilitating diffusion of the underfill material. Accordingly, the void (310 of FIG. 4) is prevented from being formed in the underfill layer 300, thereby increasing the reliability of the semiconductor package 1.

Hereinafter, a semiconductor package (2) according to a second embodiment of the present inventive concept will be described with reference to FIG. 6. Thus, a description of the same content as above in the first embodiment is not repeated or is briefly described.

Figure 6:
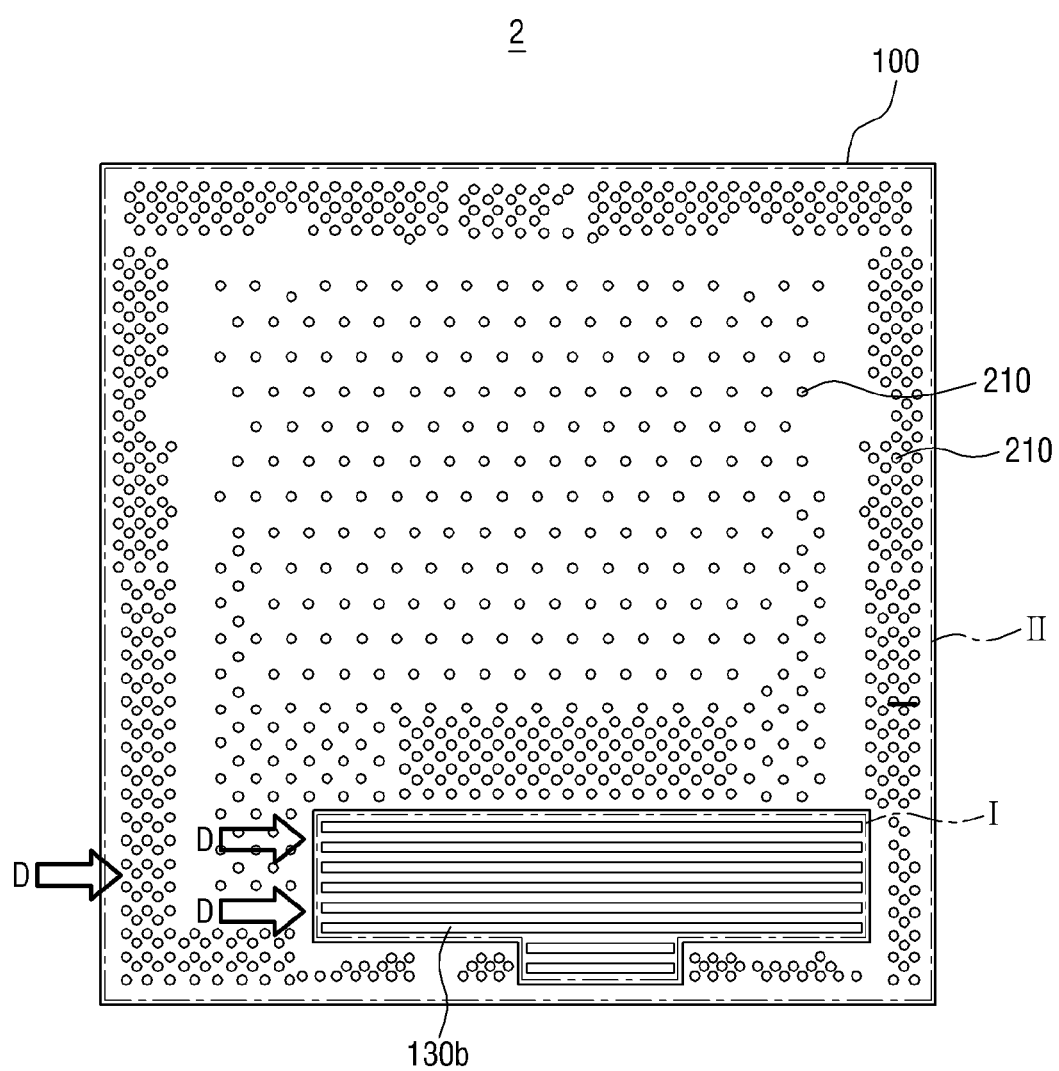
FIG. 6 is a plan view for explaining a void preventing pattern of a semiconductor package according to a second embodiment of the inventive concept.

FIG. 6 is a plan view for explaining void preventing patterns of a semiconductor package according to a second embodiment of the present inventive concept.

Referring to FIG. 6, a first region I includes second void preventing patterns 130b. The second void preventing patterns 130b may be formed under semiconductor chips 200. The second void preventing patterns 130b may be formed in the first region I. The second void preventing patterns 130b may include a plurality of patterns separated from each other by a predetermined interval. Each of the second void preventing patterns 130b may be a pattern shaped of a bar. Each of the second void preventing patterns 130b may extend in a second direction D. The second void preventing patterns 130b may be arranged such that the underfill material supplied in the second direction D is rapidly diffused. In other words, the bars of the second void preventing patterns 103b may be arranged in parallel to the second direction D.

The second direction D may be a direction in which the underfill material is dispensed. That is to say, the second direction D may be a direction in which the underfill material is injected between the semiconductor chips 200 and the substrate 100. In FIG. 6, the underfill material may be injected from a left portion of the drawing in the second direction D.

Since the underfill material is injected in the second direction D in the first region I, it may be diffused along the second void preventing patterns 130b extending in the second direction D. In this case, the void (310 of FIG. 4) is prevented from being formed in the first region.

The second void preventing patterns 130b may not be in direct contact with the semiconductor chips 200. Since the second void preventing patterns 130b are not in contact with the bottom surfaces of the semiconductor chips 200, the underfill material is not necessarily diffused only to regions separated by the second void preventing patterns 130b. That is to say, since there are regions on the second void preventing patterns 130b, through which the underfill material may flow, the underfill material may flow on the second void preventing patterns 130b to then fill the regions on the second void preventing patterns 130b as well.

Hereinafter, a semiconductor package (3) according to a third embodiment of the present inventive concept will be described with reference to FIG. 7. Thus, a description of the same content as above in the first and second embodiments is not repeated or is briefly described.

Figure 7:
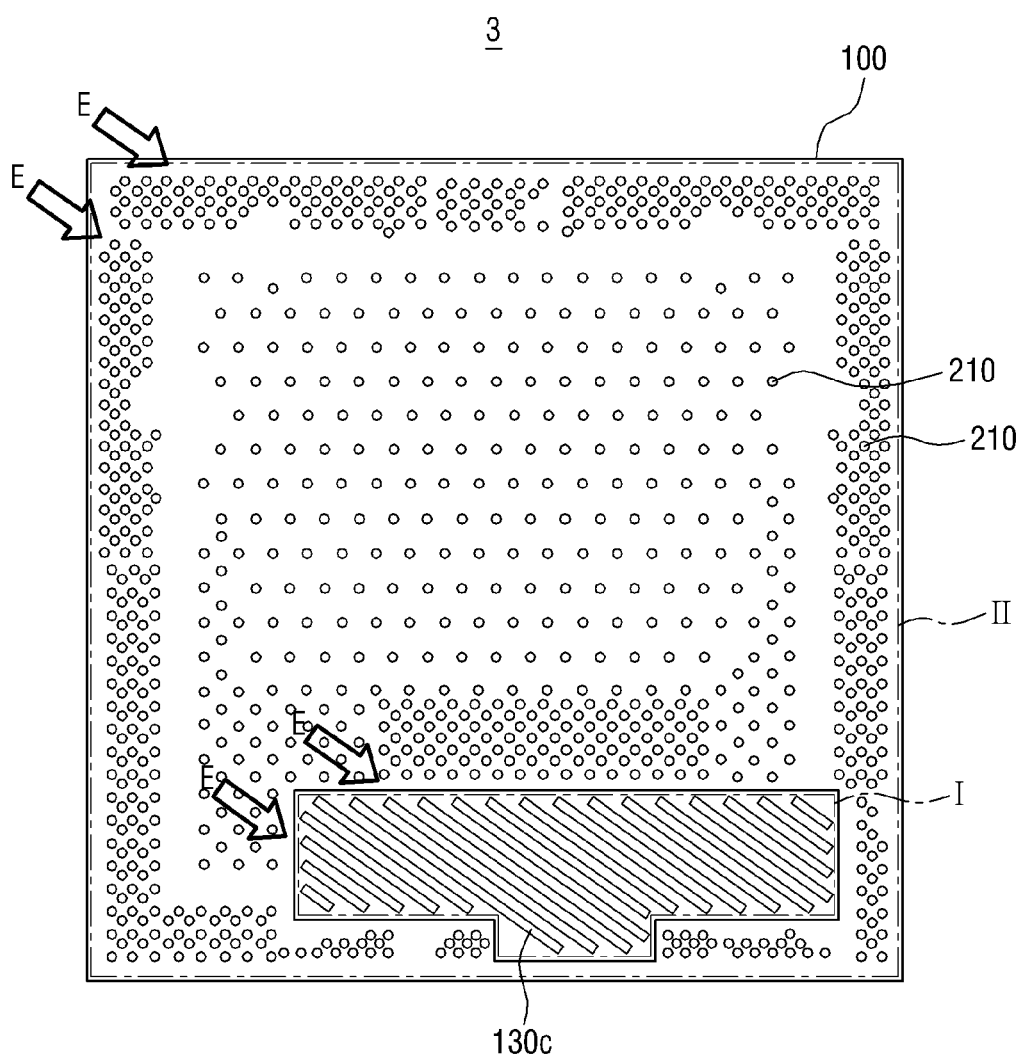
FIG. 7 is a plan view for explaining a void preventing pattern of a semiconductor package according to a third embodiment of the inventive concept.

FIG. 7 is a plan view for explaining void preventing patterns of a semiconductor package according to a third embodiment of the present inventive concept.

Referring to FIG. 7, a first region I includes third void preventing patterns 130c. The third void preventing patterns 130c may be formed under semiconductor chips 200. The third void preventing patterns 130c may be formed in the first region I. The third void preventing patterns 130c may include a plurality of patterns separated from each other by a predetermined interval. Each of the third void preventing patterns 130c may be a pattern shaped of a bar. Each of the third void preventing patterns 130c may extend in a third direction E. The third direction E may be a diagonal dispensing direction relative to edges of the substrate 100, where the edges of the substrate 100 form a rectangle or square. The third void preventing patterns 130c may be arranged such that the underfill material supplied in the third direction E is rapidly diffused. In other words, the bars of the third void preventing patterns 103c may be arranged in parallel to the third direction E.

The third direction E may be a direction in which the underfill material is dispensed. That is to say, the third direction E may be a direction in which the underfill material is injected between the semiconductor chips 200 and the substrate 100. In FIG. 7, the underfill material may be injected from top and left portions of the drawing in the third direction E.

Since the underfill material is injected in the third direction E in the first region I, it may be diffused along the third void preventing patterns 130c extending in the third direction E. In this case, the void (310 of FIG. 4) is prevented from being formed in the first region I.

The third void preventing patterns 130c may not be in direct contact with the semiconductor chips 200. Since the third void preventing patterns 130c are not in contact with the bottom surfaces of the semiconductor chips 200, the underfill material is not necessarily diffused only to regions separated by the third void preventing patterns 130c. That is to say, since there are regions on the third void preventing patterns 130c, through which the underfill material may flow, the underfill material may flow on the third void preventing patterns 130c to then fill the regions on the third void preventing patterns 130c as well.

Hereinafter, a semiconductor package (4) according to a fourth embodiment of the present inventive concept will be described with reference to FIG. 8. Thus, a description of the same content as above in the first to third embodiments is not repeated or is briefly described.

Figure 8:
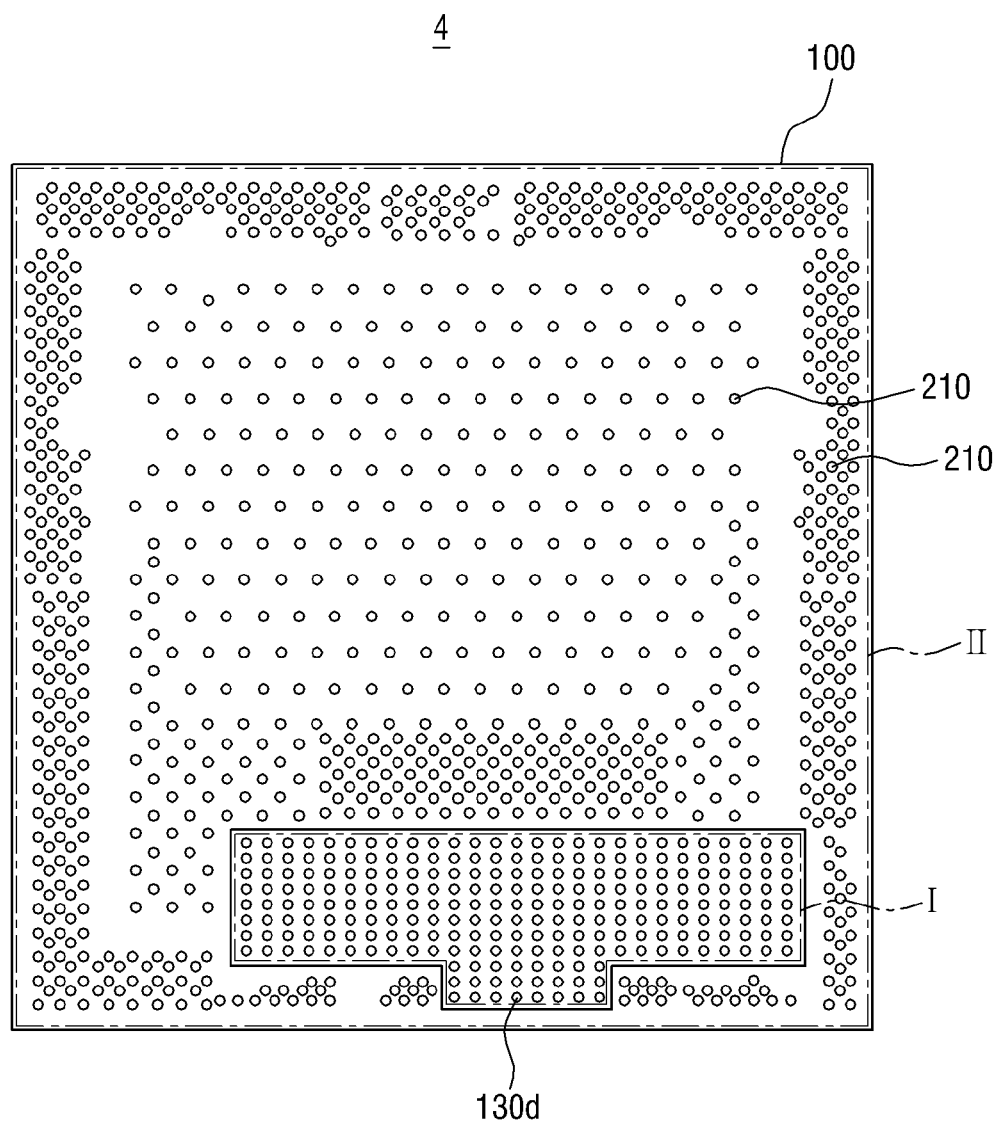
FIG. 8 is a plan view for explaining a void preventing pattern of a semiconductor package according to a fourth embodiment of the inventive concept.

FIG. 8 is a plan view for explaining void preventing patterns of a semiconductor package according to a fourth embodiment of the present inventive concept.

Referring to FIG. 8, a first region I includes fourth void preventing patterns 130d. The fourth void preventing patterns 130d may be formed under semiconductor chips 200. The fourth void preventing patterns 130d may be formed in the first region I. The fourth void preventing patterns 130d may include a plurality of patterns separated from each other by a predetermined interval. Each of the fourth void preventing patterns 130d may be a pattern shaped of a three-dimensional dot or mound. Each of the fourth void preventing patterns 130d may be a dot or mound pattern not extending in any particular direction. In other words, the fourth void preventing patterns 130d may be symmetrically arranged and/or spaced apart from each other by a predetermined interval. The fourth void preventing patterns 130d may be separated from each other and shaped as individual islands. The fourth void preventing patterns 130d may be arranged such that the underfill material supplied to the first region I is rapidly diffused.

That is to say, the diffusion speed of the underfill material may vary at various portions in the second region II according to a difference in the density of the solder bumps 210. Therefore, the dispensing direction of the underfill material and the diffusion direction of the underfill material at a boundary of the first region I may not accurately coincide with each other. Therefore, the fourth void preventing patterns 130d may not extend in a predetermined direction. That is to say, a void (320 of FIG. 4) is prevented from being formed by reducing a sectional area of a region through which the underfill material flows by the fourth void preventing patterns 130d.

The fourth void preventing patterns 130d may not be in direct contact with the semiconductor chips 200. Since the fourth void preventing patterns 130d are not in contact with the bottom surfaces of the semiconductor chips 200, the underfill material is not necessarily diffused only to regions separated by the fourth void preventing patterns 130d. That is to say, since there are regions on the fourth void preventing patterns 130d, through which the underfill material may flow, the underfill material may flow on the fourth void preventing patterns 130d to then fill the regions on the fourth void preventing patterns 130d as well.

Hereinafter, a semiconductor package (5) according to a fifth embodiment of the present inventive concept will be described with reference to FIG. 9. Thus, a description of the same content as above in the first to fourth embodiments is not repeated or is briefly described.

Figure 9:
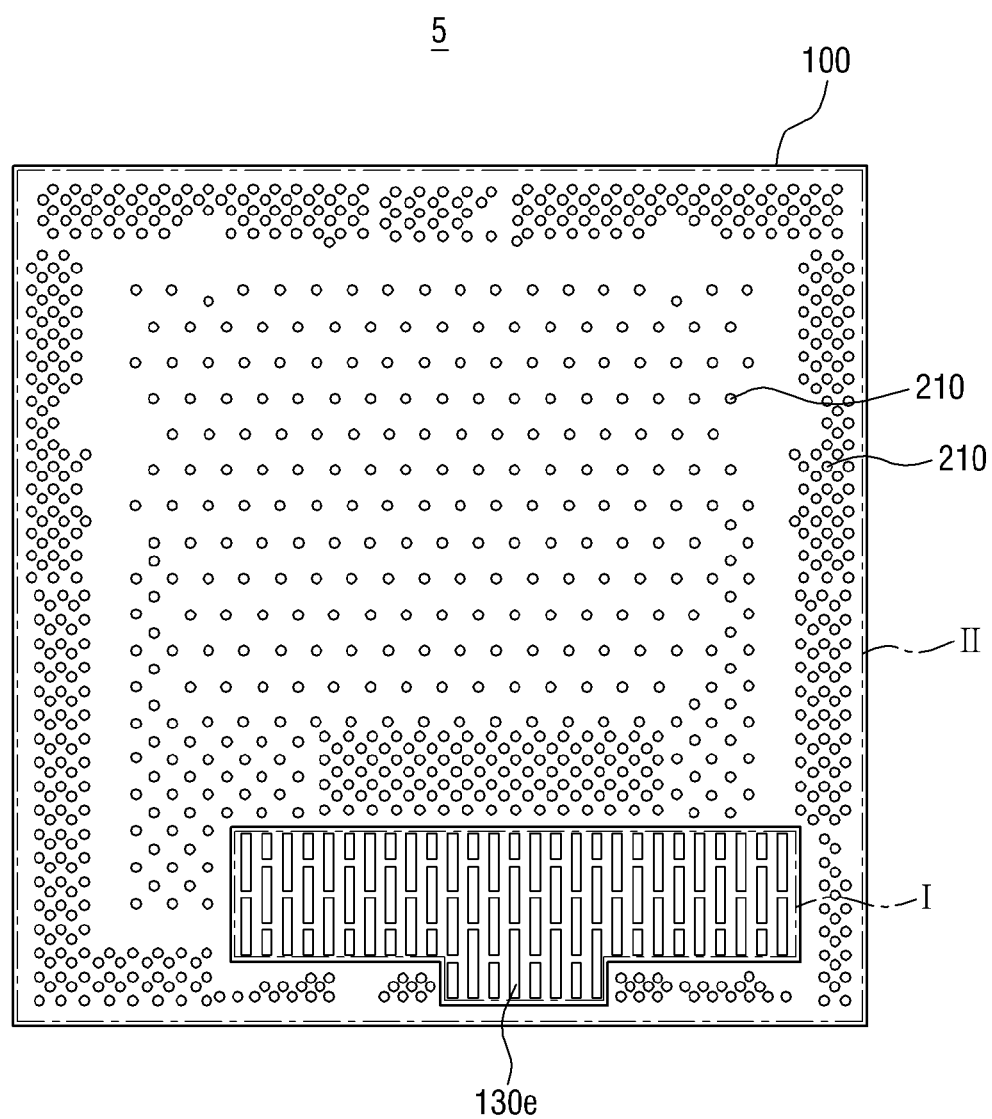
FIG. 9 is a plan view for explaining a void preventing pattern of a semiconductor package according to a fifth embodiment of the inventive concept.

FIG. 9 is a plan view for explaining void preventing patterns of a semiconductor package according to a fifth embodiment of the present inventive concept.

Referring to FIG. 9, a first region I includes fifth void preventing patterns 130e. The fifth void preventing patterns 130e may be formed under semiconductor chips 200. The fifth void preventing patterns 130e may be formed in the first region I. The fifth void preventing patterns 130e may be formed in the first region I. The fifth void preventing patterns 130e may include a plurality of patterns separated from each other by a predetermined interval. Each of the fifth void preventing patterns 130e may be a pattern shaped of a discontinuous or broken bar. Each of the fifth void preventing patterns 130e may extend in a predetermined direction. The fifth void preventing patterns 130e may be arranged such that the underfill material supplied in the predetermined is rapidly diffused.

The predetermined direction may be a direction in which the underfill material is dispensed. That is to say, the predetermined direction may be a direction in which the underfill material is injected between the semiconductor chips 200 and the substrate 100. In FIG. 9, the underfill material may be injected from a top portion of the drawing in the predetermined direction.

Since the underfill material is injected in the predetermined direction in the first region I, it may be diffused along the fifth void preventing patterns 130e extending in the predetermined direction. In this case, the void (310 of FIG. 4) is prevented from being formed in the first region I.

That is to say, the diffusion speed of the underfill material may vary at various portions in the second region II according to a difference in the density of the solder bumps 210. Therefore, the dispensing direction of the underfill material and the diffusion direction of the underfill material at a boundary of the first region I may not accurately coincide with each other. Trenches or discontinuities separating the fifth void preventing patterns 130e shaped of bars from each other may be formed while extending the fifth void preventing patterns 130e in the predetermined direction. The diffusion speed of the underfill material having directional components other than the predetermined direction may therefore be maintained.

The fifth void preventing patterns 130e may not be in direct contact with the semiconductor chips 200. Since the fifth void preventing patterns 130e are not in contact with the bottom surfaces of the semiconductor chips 200, the underfill material is not necessarily diffused only to regions separated by the fifth void preventing patterns 130e. That is to say, since there are regions on the fifth void preventing patterns 130e, through which the underfill material may flow, the underfill material may flow on the fifth void preventing patterns 130e to then fill the regions on the fifth void preventing patterns 130e as well.

Hereinafter, a semiconductor package (6) according to a sixth embodiment of the present inventive concept will be described with reference to FIG. 10. Thus, a description of the same content as above in the first to fifth embodiments is not repeated or is briefly described.

Figure 10:
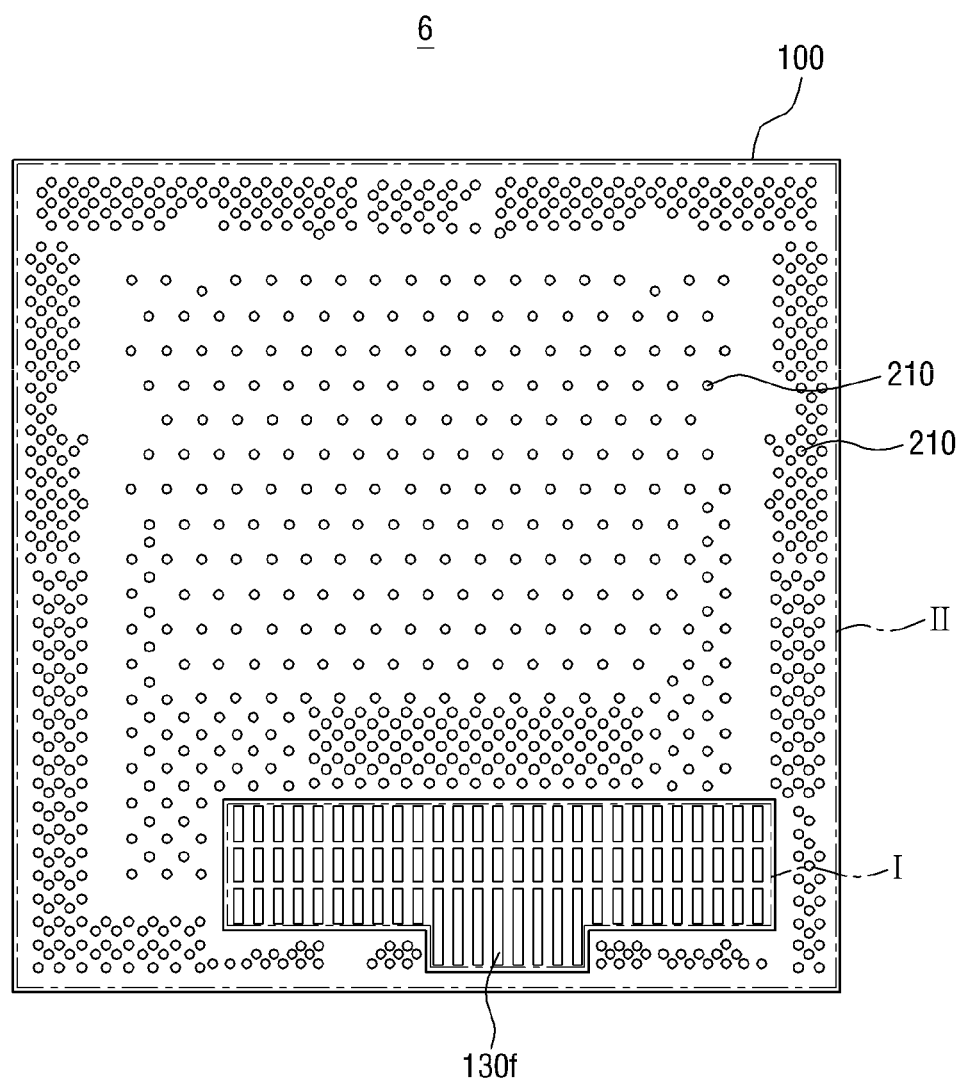
FIG. 10 is a plan view for explaining a void preventing pattern of a semiconductor package according to a sixth embodiment of the inventive concept.

FIG. 10 is a plan view for explaining void preventing patterns of a semiconductor package according to a fifth embodiment of the present inventive concept.

Referring to FIG. 10, a first region I includes sixth void preventing patterns 130f. The sixth void preventing patterns 130f may be formed under semiconductor chips 200. The sixth void preventing patterns 130f may be formed in the first region I. The sixth void preventing patterns 130f may include a plurality of patterns separated from each other by a predetermined interval. Each of the sixth void preventing patterns 130f may be a pattern shaped of a bar. Each of the sixth void preventing patterns 130f may extend in a predetermined direction. The sixth void preventing patterns 130f may be arranged such that the underfill material supplied in the predetermined direction is rapidly diffused.

The predetermined direction may be a direction in which the underfill material is dispensed. That is to say, the predetermined direction may be a direction in which the underfill material is injected between the semiconductor chips 200 and the substrate 100. In FIG. 10, the underfill material may be injected from a top portion of the drawing in the predetermined direction.

Since the underfill material is injected in the predetermined direction in the first region I, it may be diffused along the sixth void preventing patterns 130f extending in the predetermined direction. In this case, the void (310 of FIG. 4) is prevented from being formed in the first region I.

That is to say, the diffusion speed of the underfill material may vary at various portions in the second region II according to a difference in the density of the solder bumps 210. Therefore, the dispensing direction of the underfill material and the diffusion direction of the underfill material at a boundary of the first region I may not accurately coincide with each other. Trenches or discontinuities separating the sixth void preventing patterns 130f shaped of bars from each other may be formed while extending the sixth void preventing patterns 130f in the predetermined direction. The diffusion speed of the underfill material having directional components other than the predetermined direction may be maintained.

The bar patterns and the trenches separating the bar patterns of the sixth void preventing patterns 130f from each other may be aligned side by side. Some of the bars in the sixth void preventing patterns 130f may have a length that is longer than other bars in the sixth void preventing patterns 130f. As the bar patterns and the trenches are aligned, the underfill material may be rapidly diffused, irrespective of the direction that the underfill material is originally dispensed.

The sixth void preventing patterns 130f may not be in direct contact with the semiconductor chips 200. Since the sixth void preventing patterns 130f are not in contact with the bottom surfaces of the semiconductor chips 200, the underfill material is not necessarily diffused only to regions separated by the sixth void preventing patterns 130f. That is to say, since there are regions on the sixth void preventing patterns 130f, through which the underfill material may flow, the underfill material may flow on the sixth void preventing patterns 130f to then fill the regions on the sixth void preventing patterns 130f as well.

In semiconductor packages according to some embodiments of the present inventive concept, the flow of the underfill material can be facilitated, thereby preventing the void 310 (of FIG. 4) from being formed in the underfill layer 300. Accordingly, the reliability and durability of the semiconductor package can be enhanced.

Hereinafter, a printed circuit board (500) according to an embodiment of the present inventive concept will be described with reference to FIG. 11. The printed circuit board 500 may correspond to a substrate (e.g., 100 of FIGS. 5-10) of each of the semiconductor packages according to the first to sixth embodiments of the present inventive concept.

Figure 11:
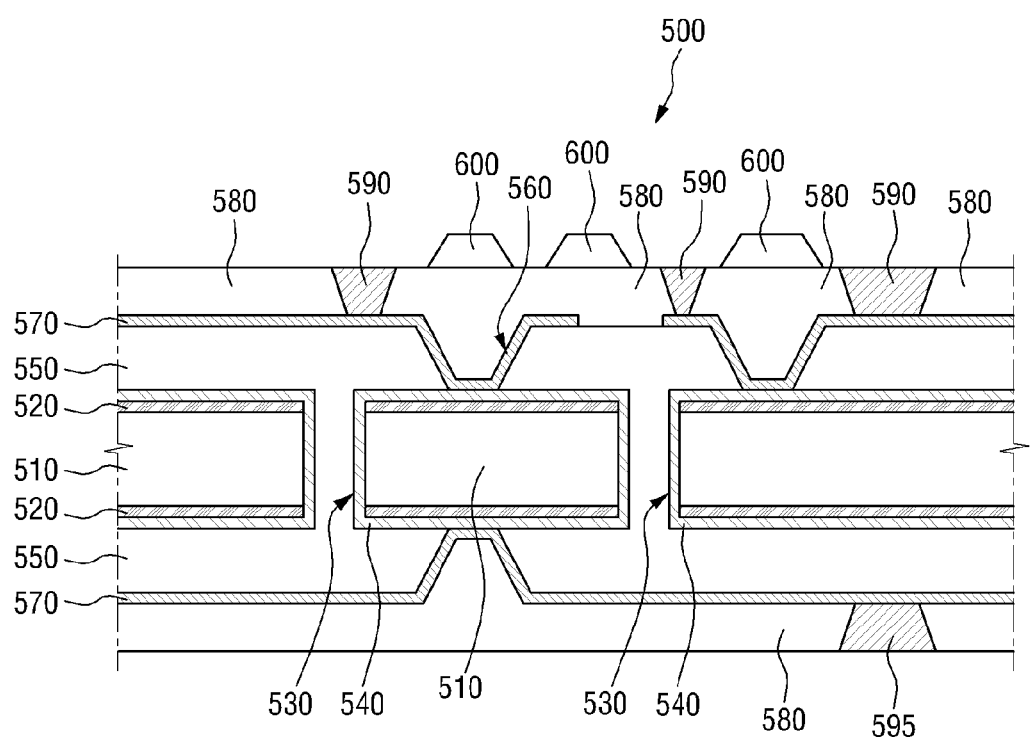
FIG. 11 is a cross-sectional view for explaining a printed circuit board according to example embodiments of the inventive concept.

FIG. 11 is a cross-sectional view for explaining a printed circuit board according to an embodiment of the present inventive concept.

Referring to FIG. 11, the printed circuit board 500 according to an embodiment of the present inventive concept includes an inner resin layer 510, first conductive coatings 520 and 540, an outer resin layer 550, and a first solder resist layer 580.

The inner resin layer 510 may be the innermost layer of the printed circuit board 500. The inner resin layer 510 may include a resin, but aspects of the present inventive concept are not limited thereto. The inner resin layer 510 may include a plurality of penetrating holes 530. The inner resin layer 510 may include the first conductive coatings 520 and 540 formed on its top and bottom surfaces.

The penetrating holes 530 may penetrate the inner resin layer 510 and surface coatings 520 of the first conductive coatings 520 and 540. The penetrating holes 530 may serve as electrical paths for connecting top and bottom surfaces of the printed circuit board 500. A hole coating 540 from among the first conductive coatings 520 and 540 may be formed on inner walls of the penetrating holes 530.

The first conductive coatings 520 and 540 may be coated on a surface of the inner resin layer 510 more thinly than the inner resin layer 510. The first conductive coatings 520 and 540 may include a conductive material. The conductive material may include, for example, copper (Cu). The first conductive coatings 520 and 540 may include the surface coatings 520 positioned on top and bottom surfaces of the inner resin layer 510, and the hole coating 540 positioned on the inner walls of the penetrating holes 530 and on the surface coatings 520.

The surface coatings 520 may be positioned on at least one of the top and bottom surfaces of the inner resin layer 510 in the form of a thin film. In some embodiments, the surface coatings 520 are positioned on only one of the top and bottom surfaces of the inner resin layer 510, and therefore only a single surface of the printed circuit board 500 may be used. In some embodiments, the surface coatings 520 are positioned on both of the top and bottom surfaces of the inner resin layer 510, and therefore both surfaces of the printed circuit board 500 may be used.

The hole coating 540 may be formed on the inner walls of the penetrating holes 530. In addition, the hole coating 540 may be formed on a top surface of the surface coatings 520. In detail, the hole coating 540 may connect the surface coatings 520 formed on its top and bottom surfaces.

The outer resin layer 550 may cover the first conductive coatings 520 and 540. More specifically, the outer resin layer 550 may cover the inner resin layer 510 and the first conductive coatings 520 and 540. The outer resin layer 550 may fill the penetrating holes 530 of the inner resin layer 510. The outer resin layer 550 may be formed on both of the top and bottom surfaces of the inner resin layer 510. That is to say, the outer resin layer 550 may be formed on the first conductive coatings 520 and 540 positioned on the top surface of the inner resin layer 510, and the first conductive coatings 520 and 540 positioned on the bottom surface of the inner resin layer 510. Accordingly, the first conductive coatings 520 and 540 may not be exposed to the outside.

The outer resin layer 550 may include the same or similar material as the inner resin layer 510, but aspects of the present inventive concept are not limited thereto. However, the outer resin layer 550 and the inner resin layer 510 may include the same or similar material. The outer resin layer 550 may include a resin, like the inner resin layer 510, but aspects of the present inventive concept are not limited thereto.

The outer resin layer 550 may include vias 560. The vias 560 may expose the first conductive coatings 520 and 540 to the outside. The vias 560 of the outer resin layer 550 may be positioned on at least one of the top and bottom surfaces of the outer resin layer 550.

Second conductive coatings 570 may be formed on the outer resin layer 550. The second conductive coatings 570 may be coated on a surface of the outer resin layer 550 more thinly than the outer resin layer 550. More specifically, the second conductive coatings 570 may be formed on top and bottom surfaces of the outer resin layer 550. The second conductive coatings 570 may include a conductive material. The conductive material may include, for example, Cu.

The second conductive coatings 570 may be used to form circuits or wiring patterns of the printed circuit board 500. That is to say, the second conductive coatings 570 may be printed in various patterns according to functions of the printed circuit board 500. In other words, the second conductive coatings 570 may not cover the entire top surface of the outer resin layer 550, but rather, may cover a portion of the top surface of the outer resin layer 550. That is to say, the second conductive coatings 570 may be used to form a plurality of patterns separated from each other.

The second conductive coatings 570 may also be formed on inner walls of the vias 560. The second conductive coatings 570 may also be formed on bottom surfaces of the vias 560. Since the first conductive coatings 520 and 540 are exposed by the bottom surfaces of the vias 560, the second conductive coatings 570 may be formed on the exposed top surfaces of the first conductive coatings 520 and 540. Accordingly, the second conductive coatings 570 may be electrically connected to the first conductive coatings 520 and 540.

The first solder resist layer 580 may be formed on the second conductive coatings 570 and the top surface of the outer resin layer 550. The first solder resist layer 580 may basically cover both of the second conductive coatings 570 and the outer resin layer 550. The first solder resist layer 580 may not cover a portion where a connection pad 590 is formed. Therefore, the first solder resist layer 580 may cover all of the portions, except for the portion where the connection pad 590 is formed. Since the first solder resist layer 580 forms a top surface of the printed circuit board 500, it may be planarly formed.

The first solder resist layer 580 may be formed by coating a film type or liquid type solder resist material, exposing, etching and curing the same. The first solder resist layer 580 may protect the inside of the printed circuit board 500 against moisture and may insulate the respective patterns of the second conductive coatings 570 from each other.

The connection pad 590 may be formed on a region where the first solder resist layer 580 is not formed. The connection pad 590 may include conductive pads exposed to the outside. The connection pad 590 may be positioned on the top surface of the printed circuit board 500. The connection pad 590 may be connected to an external solder bump.

The solder ball pad 595 may be formed on a region where the first solder resist layer 580 is not formed. The solder ball pad 595 may be a conductive pad exposed to the outside. The solder ball pad 595 may be positioned on the bottom surface of the printed circuit board 500. The solder ball pad 595 may be connected to an external solder bump.

The second solder resist layer 600 may be formed on the first solder resist layer 580. The second solder resist layer 600 may be formed on the top surface of the printed circuit board 500. That is to say, the first solder resist layer 580 may be positioned on both of the top and bottom surfaces of the printed circuit board 500, and the second solder resist layer 600 may be formed on the first solder resist layer 580 positioned on the top surface of the printed circuit board 500. The second solder resist layer 600 may be formed on the portion where the connection pad 590 is not formed.

The second solder resist layer 600 may include the same or similar material as the first solder resist layer 580. The second solder resist layer 600 may be formed through the same or similar process with the first solder resist layer 580. However, since the first solder resist layer 580 is a layer forming the top surface of the printed circuit board 500, it may be planarly formed. Alternatively, the second solder resist layer 600 may be formed such that it protrudes on a top surface of the first solder resist layer 580.

The second solder resist layer 600 may be formed on a portion where the connection pad 590 is not formed. The second solder resist layer 600 may serve as a void preventing pattern during an underfill process in the semiconductor package manufacturing process, such as the void preventing patterns described in detail above.

More specifically, semiconductor chips may be mounted on the top surface of the printed circuit board 500 and an underfill layer may be formed between the semiconductor chips and the printed circuit board 500, thereby enhancing the durability and reliability of the semiconductor package. The underfill layer may be formed by filling an underfill material and curing the same. During the filling of the underfill material when using conventional techniques, a void is likely to be formed due to a liquid characteristic of the underfill material.

Therefore, in order to prevent the void from being formed, the second solder resist layer 600 may be formed on the top surface of the printed circuit board 500, thereby facilitating diffusion of the underfill material. Accordingly, it is possible to prevent the void from being formed in the underfill layer. That is to say, the second solder resist layer 600 may correspond to each of the first to sixth void preventing patterns (130a to 130f of FIGS. 5 to 10) of the semiconductor packages according to the first to sixth embodiments of the present inventive concept.

Hereinafter, a printed circuit board 501 according to another embodiment of the present inventive concept will be described with reference to FIG. 12. Thus, the same content as the printed circuit board according to the previous embodiment will be briefly described or will not be described.

Figure 12:
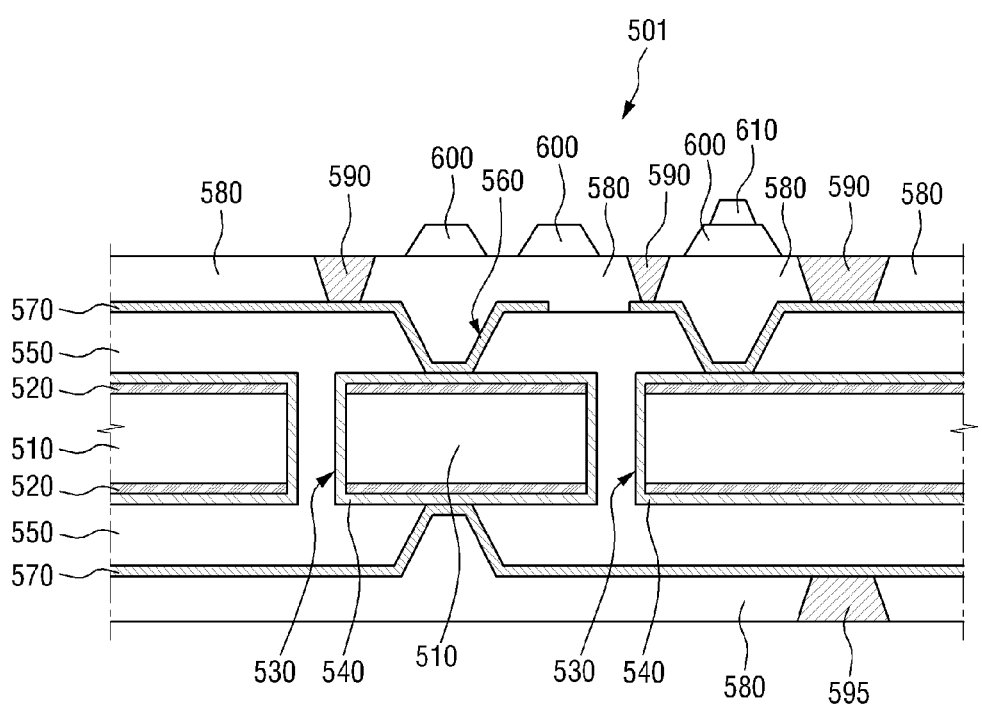
FIG. 12 is a cross-sectional view for explaining a printed circuit board according to example embodiments of the inventive concept.

FIG. 12 is a cross-sectional view for explaining a printed circuit board according to another embodiment of the present inventive concept.

Referring to FIG. 12, the printed circuit board 501 according to another embodiment of the present inventive concept includes a third solder resist layer 610.

The third solder resist layer 610 may be formed on the second solder resist layer 600. The third solder resist layer 610 may include the same or similar material as the first solder resist layer 580 or the second solder resist layer 600, but aspects of the present inventive concept are not limited thereto.

Since the third solder resist layer 610 is formed on the second solder resist layer 600, a top surface of the third solder resist layer 610 may be positioned higher than the first solder resist layer 580 and the second solder resist layer 600.

In the printed circuit board 501 according to the embodiment of the present inventive concept, a two-layered void preventing pattern may be formed by the third solder resist layer 610. That is to say, the second solder resist layer 600 and the third solder resist layer 610 may form the two-layered void preventing pattern.

In the present embodiment, the printed circuit board 501 having two layers, including the second solder resist layer 600 and the third solder resist layer 610, is illustrated, which is, however, provided only for illustration. That is to say, more solder resist layers may be additionally formed on the third solder resist layer 610. The solder resist layer may be formed without limitation in the number of layers so long as it is not brought into contact with bottom surfaces of the semiconductor chips mounted on a top surface of the printed circuit board 501. In a case where the void preventing pattern is formed of multiple layers, the flow of a fluid, such as an underfill material, may be precisely controlled, thereby efficiently preventing a void from being formed in the underfill layer.

Figure 13:
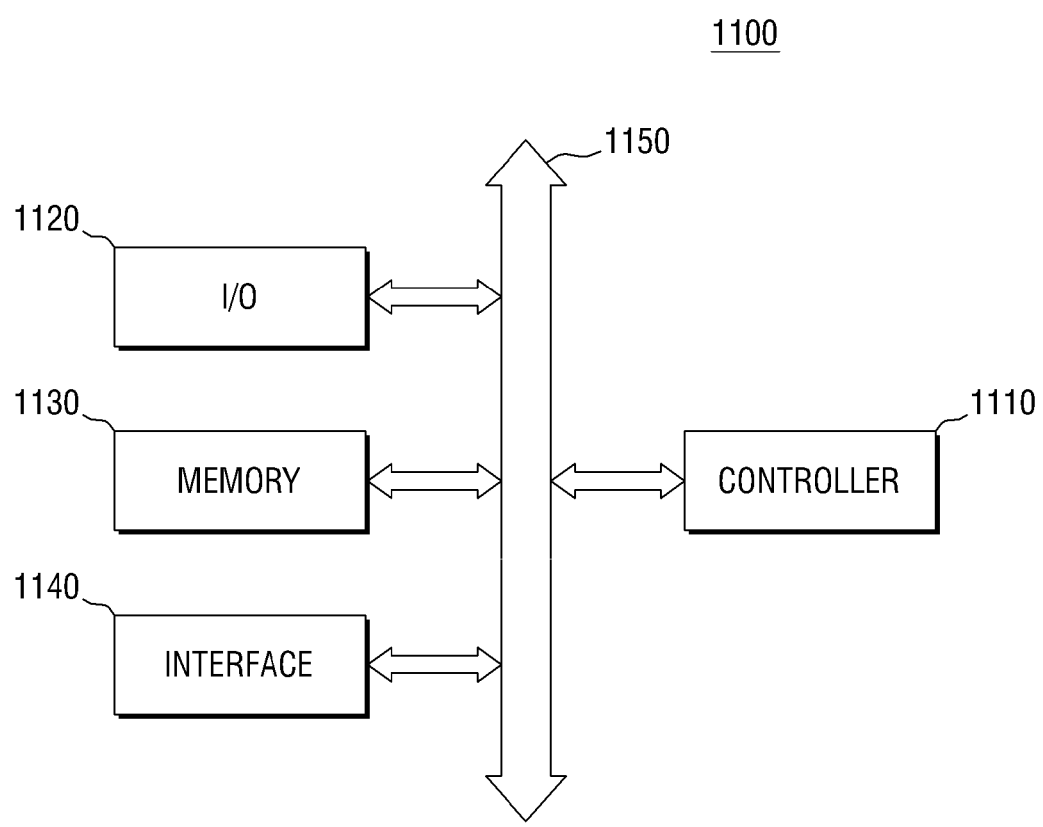
FIG. 13 is a block diagram of an electronic system including semiconductor devices according to example embodiments of the inventive concept.

FIG. 13 is a block diagram of an electronic system including semiconductor devices according to some embodiments of the present inventive concept.

Referring to FIG. 13, the electronic system 1100 may include a controller 1110, an input/output device (I/O) 1120, a memory device 1130, an interface 1140 and a bus 1150. The controller 1110, the I/O 1120, the memory device 1130 and/or the interface 1140 may be connected to each other through the bus 1150. The bus 1150 corresponds to a path along which data may move.

The controller 1110 may include at least one of a microprocessor, a digital signal processor, a microcontroller, and logic devices capable of performing functions similar to those of these components. The I/O 1120 may include a keypad, a keyboard, a display, and so on. The memory device 1130 may store data and/or commands. The interface 1140 may transmit data to a communication network or receive data from the communication network. The interface 1140 may be wired or wireless. For example, the interface 1140 may include an antenna or a wired/wireless transceiver. Although not shown, the electronic system 1100 is a working memory for improving the operation of the controller 1110 and may further include a high-speed DRAM and/or SRAM. The fin type FETs according to some embodiments of the present inventive concept may be provided in the memory device 1130 or may be provided as some components of the controller 1110, the I/O 1120, or the like.

The electronic system 1100 may be applied to a wireless communication device, such as a personal digital assistant (PDA), a portable computer, a web tablet, a wireless phone, a mobile phone, a digital music player, a memory card, or any type of electronic device capable of transmitting and/or receiving information in a wireless environment.

Figure 14:
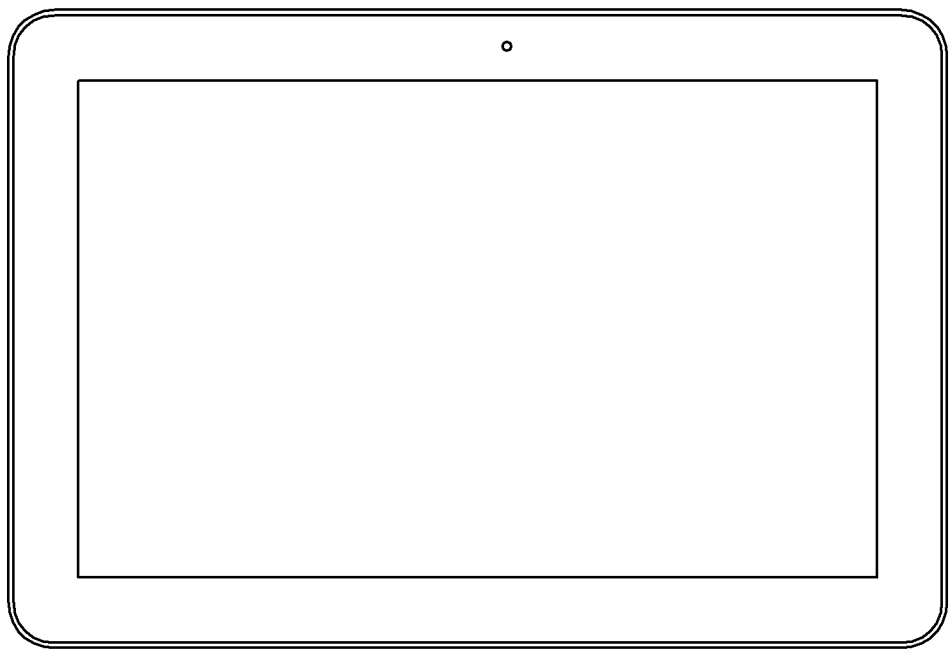
FIGS. 14 and 15 illustrate exemplary semiconductor systems, which can include the semiconductor devices according to example embodiments of the inventive concept.
Figure 15:
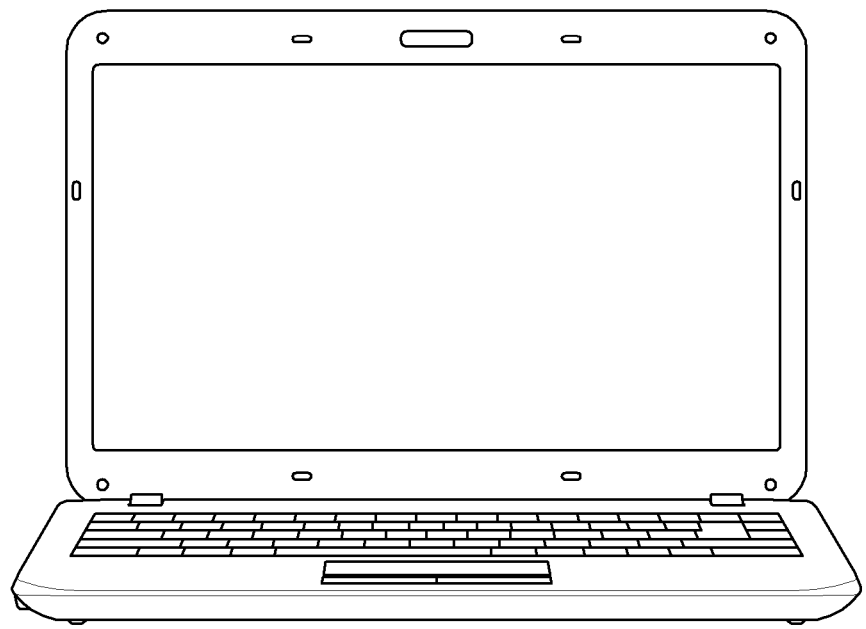

FIGS. 14 and 15 illustrate exemplary semiconductor systems to which the semiconductor devices according to some embodiments of the present inventive concept can be applied or otherwise included. Specifically, FIG. 14 illustrates a tablet PC and FIG. 15 illustrates a notebook computer. At least one of the semiconductor devices 1 to 6 (of FIGS. 1-10) according to some embodiments of the present inventive concept can be applied to or otherwise included in the tablet PC or the notebook computer. It is obvious to one skilled in the art that semiconductor devices according to some embodiments of the present inventive concept may also be applied to or otherwise included in other kinds of electronic devices not illustrated herein.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor package comprising:
   a substrate including one or more connection pads;
   semiconductor chips mounted on the substrate;
   an underfill layer filling a region between the semiconductor chips and the substrate; and
   solder bumps electrically connecting the connection pads and the semiconductor chips in the underfill layer,
   wherein the substrate includes void preventing patterns protruding on a top surface of the substrate under the underfill layer, and
   wherein the substrate includes a solder resist layer planarly formed on its surface and the void preventing patterns are formed on the solder resist layer.

2. The semiconductor package of claim 1, wherein top surfaces of the void preventing patterns are not in contact with bottom surfaces of the semiconductor chips.

3. The semiconductor package of claim 1, wherein the solder resist layer and the void preventing patterns include the same material.

4. The semiconductor package of claim 1, wherein a top surface of the solder resist layer is higher than top surfaces of the connection pads.

5. The semiconductor package of claim 4, wherein the top surfaces of the void preventing patterns are positioned higher than or at the same height with the top surface of the solder resist layer.

6. The semiconductor package of claim 1, wherein the void preventing patterns have a height in a range of 3 micrometers (μm) to 30 μm.

7. The semiconductor package of claim 1, wherein a region having the void preventing patterns is not overlapped with a region having the connection pads.

8. A semiconductor package comprising:
   a substrate including first and second regions on a top surface of the substrate, the first and second regions not overlapping with each other;
   a plurality of connection pads spaced apart from each other on the first region; and
   void preventing patterns protruding on the second region of the top surface of the substrate,
   wherein the void preventing patterns include bar patterns shaped of bars separated from each other by a predetermined distance.

9. The semiconductor package of claim 8, further comprising semiconductor chips mounted on the substrate that overlap the first and second regions.

10. The semiconductor package of claim 9, wherein the semiconductor chips include solder bumps disposed at bottom surfaces thereof to be brought into contact with the connection pads.

11. The semiconductor package of claim 8, wherein the bar patterns extend in one direction in parallel with each other.

12. The semiconductor package of claim 8, wherein at least some of the bar patterns include one or more trenches separating the bar patterns from each other.

13. A semiconductor package comprising:
   a substrate including a plurality of connection pads in a first region;
   one or more semiconductor chips;
   a plurality of solder bumps electrically connecting the plurality of connection pads in the first region to the one or more semiconductor chips;
   a second region between the substrate and the one or more semiconductor chips in which no connection pads and no solder bumps are disposed;
   an underfill layer disposed between the substrate and the one or more semiconductor chips, the underfill layer encapsulating the plurality of solder bumps; and
   a plurality of void preventing patterns disposed in the second region, the plurality of void preventing patterns configured to prevent a void in the underfill layer.

14. The semiconductor package of claim 13, wherein:
   the plurality of void preventing patterns include a plurality of bars in parallel with each other,
   the plurality of bars are not in direct contact with the one or more semiconductor chips,
   the plurality of bars extend in a dispensing direction of the underfill layer, and
   the plurality of bars are arranged in parallel with the dispensing direction.

* * * * *